US009806719B1

(12) United States Patent
Mathew et al.

(10) Patent No.: US 9,806,719 B1
(45) Date of Patent: Oct. 31, 2017

(54) PHYSICALLY UNCLONABLE CIRCUIT HAVING A PROGRAMMABLE INPUT FOR IMPROVED DARK BIT MASK ACCURACY

(71) Applicant: Intel Corporation, Santa Clara, CA (US)

(72) Inventors: Sanu K. Mathew, Hillsboro, OR (US); Sudhir K. Satpathy, Hillsboro, OR (US); Vikram B. Suresh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/280,783

(22) Filed: Sep. 29, 2016

(51) Int. Cl.
*H03K 19/00* (2006.01)
*H03K 19/177* (2006.01)

(52) U.S. Cl.
CPC ... *H03K 19/17764* (2013.01); *H03K 19/1776* (2013.01)

(58) Field of Classification Search
CPC ......... G06F 21/70–21/72; G06F 21/75–21/76; H03K 19/17768; H04L 19/32; H04L 19/3205; H04L 19/3247
USPC ...................................... 326/8–9, 14, 37–38
See application file for complete search history.

(56) References Cited

U.S. PATENT DOCUMENTS

| 8,387,071 | B2 * | 2/2013 | Potkonjak | G06F 21/74 326/8 |
|---|---|---|---|---|
| 8,928,347 | B2 | 1/2015 | Gotze et al. | |
| 9,048,834 | B2 | 6/2015 | Li et al. | |
| 9,082,514 | B1 * | 7/2015 | Trimberger | G11C 29/06 |
| 9,262,256 | B2 | 2/2016 | Mathew et al. | |
| 9,276,583 | B1 | 3/2016 | Satpathy et al. | |
| 9,279,850 | B1 * | 3/2016 | Pedersen | H03K 19/003 |
| 9,391,617 | B2 | 7/2016 | Mathew et al. | |
| 9,501,664 | B1 * | 11/2016 | Hamlet | G06F 21/71 |
| 2010/0293384 | A1 * | 11/2010 | Potkonjak | H04L 9/3247 713/176 |
| 2012/0081143 | A1 * | 4/2012 | Behrends | H04L 9/0866 326/8 |
| 2013/0047209 | A1 * | 2/2013 | Satoh | H04L 9/3278 726/2 |
| 2013/0276151 | A1 * | 10/2013 | Lewis | G06F 21/70 726/34 |
| 2014/0218067 | A1 * | 8/2014 | Li | H03K 19/17768 326/8 |
| 2014/0266297 | A1 * | 9/2014 | Mathew | H03K 19/00369 326/9 |
| 2014/0327469 | A1 * | 11/2014 | Pfeiffer | H03K 19/003 326/8 |
| 2015/0028847 | A1 * | 1/2015 | Vanhoucke | G09C 1/00 324/72 |
| 2015/0178143 | A1 * | 6/2015 | Mathew | G06F 11/0793 714/5.1 |
| 2015/0188707 | A1 * | 7/2015 | Gehrer | H04L 9/14 380/30 |
| 2015/0236698 | A1 * | 8/2015 | Pedersen | H03K 19/00384 326/8 |
| 2016/0182045 | A1 * | 6/2016 | Mai | G09C 1/00 326/8 |

(Continued)

*Primary Examiner* — Jason M Crawford
(74) *Attorney, Agent, or Firm* — Compass IP Law PC

(57) ABSTRACT

An apparatus is described. The apparatus includes a physically unclonable (PUF) circuit having a programmable input. The programmable input is to receive a value that caused the PUF circuit to strengthen its stability or strengthen its instability.

23 Claims, 5 Drawing Sheets

(56) References Cited

U.S. PATENT DOCUMENTS

2016/0285639 A1    9/2016  Mathew et al.

* cited by examiner

PHYSICALLY UNCLONABLE CIRCUIT HAVING A PROGRAMMABLE INPUT FOR IMPROVED DARK BIT MASK ACCURACY

FIELD OF INVENTION

The field of invention pertains generally to the semiconductor arts, and, more specifically, to a physically unclonable circuit having a programmable input for improved dark bit mask accuracy.

BACKGROUND

With the increased miniaturization of circuits and the dimensions of their constituent structures (e.g., transistors), reliability problems may become more prevalent particularly for circuits exposed to extreme environmental conditions (e.g., performance, temperature, etc.). As such, it behooves system designers to include embedded functions that detect the presence of a reliability issue before a catastrophic failure event occurs.

FIGURES

Figure 1:
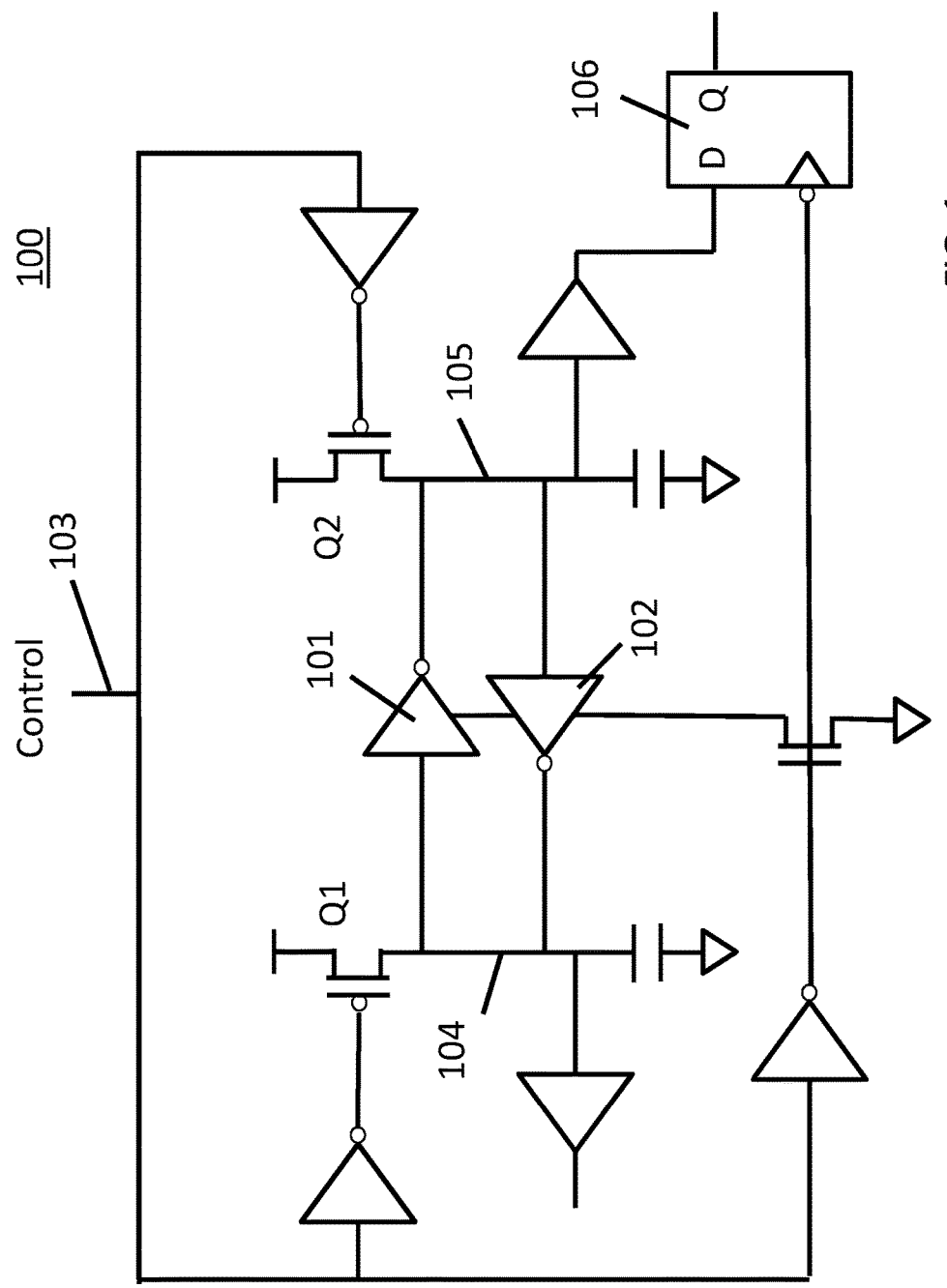
Figure 2:
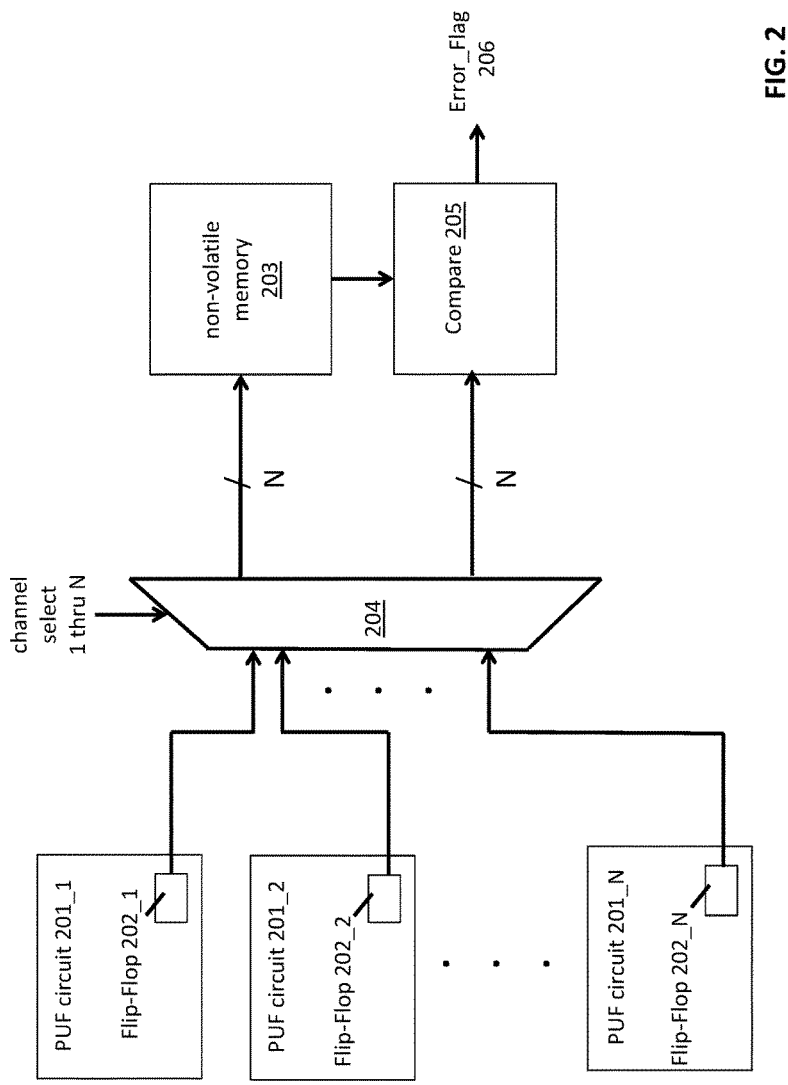
Figure 3:
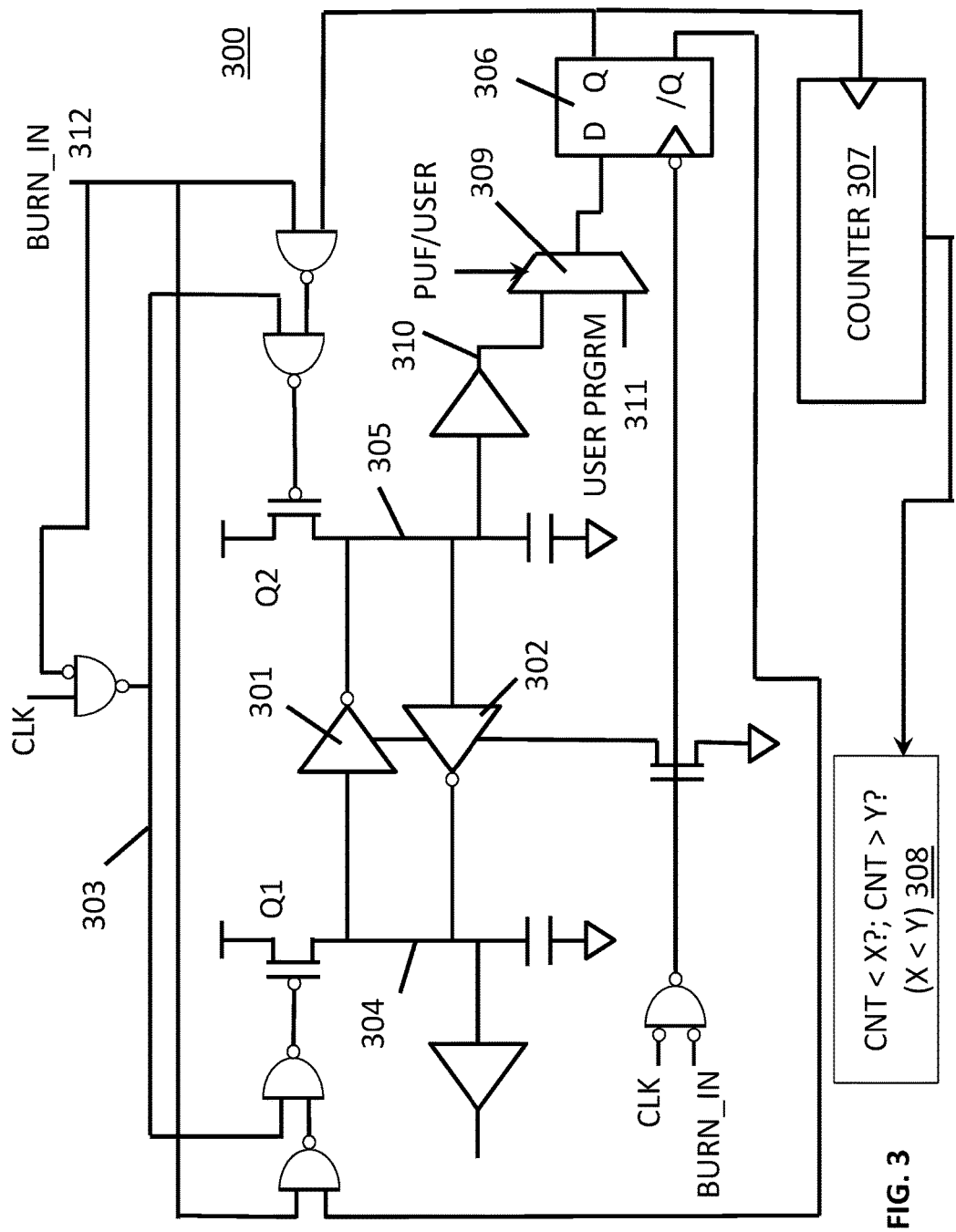
Figure 4:
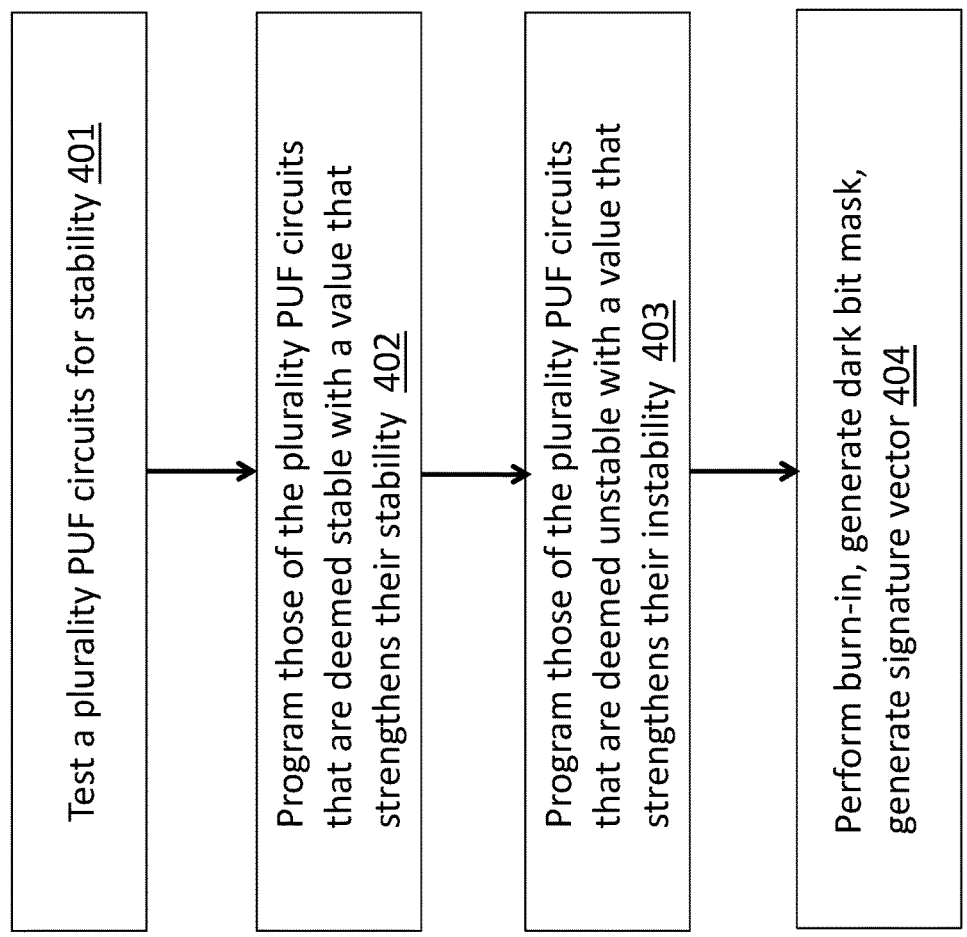
Figure 5:
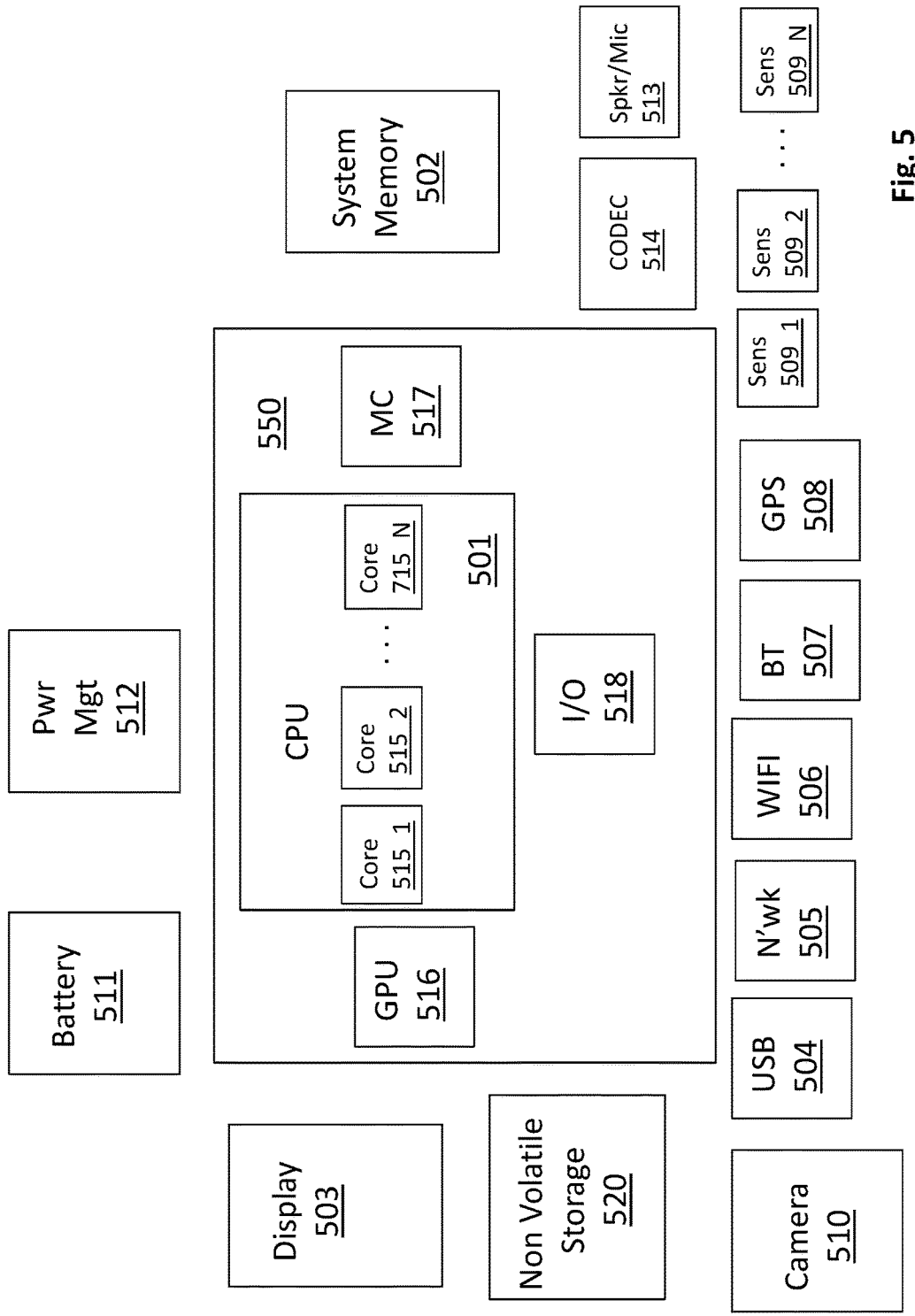

A better understanding of the present invention can be obtained from the following detailed description in conjunction with the following drawings, in which:

FIG. 1 shows an embodiment of a PUF circuit;
FIG. 2 shows an embodiment of a circuit that detects circuit degradation;
FIG. 3 shows another embodiment of a PUF circuit;
FIG. 4 shows a methodology for burning-in PUF circuits;
FIG. 5 shows an embodiment of a computing system.

DETAILED DESCRIPTION

Circuits are generally designed to be insensitive (as much as practicable) to manufacturing tolerances. However, a class of circuits may be designed that are purposefully sensitive to manufacturing tolerances (so called, "physically unclonable circuits" or PUFs). For instance, a circuit that is implemented on a semiconductor chip may be designed to have a measurable or determinable property that is highly sensitive to the threshold and/or the gain of its constituent transistors.

With significant sensitivity to certain parameters, and with the underlying manufacturing process having inherent variation with respect to these same parameters, identically designed instances of the circuit can exhibit different properties even if manufactured on the same semiconductor chip. FIG. 1 shows an example of a PUF circuit 100 that if implemented on a semiconductor chip will have properties that are sensitive to the threshold and gain of its constituent transistors.

As observed in FIG. 1, the PUF circuit 100 includes a pair of inverters 101, 102 with the respective output of both inverters being coupled to the respective input of the other inverter. Those of ordinary skill will recognize cross coupled inverters 101, 102 implement a latch circuit that is inherently stable by itself (a 0 at the input of a first inverter provides a 1 at the input of the second inverter which re-enforces the 0 applied at the first inverter). Here, the circuit 100 operates according this stable mode when both of transistors Q1 and Q2 are off which occurs when the control node 103 is set to a logic 0.

However, when the control node 103 transitions to a logic 1, the circuit 100 attempts to turn on both of transistors Q1 and Q2, which initially places the circuit into an unstable state. The unstable state will quickly return to a stable state if there is sufficient manufacturing variation amongst the different transistors of the inverters 101, 102, transistors Q1 and Q2 and/or the interconnect resistances between them. That is, although the circuit 100 as designed is symmetrical or balanced, owing to manufacturing tolerances, it may not actually be symmetrical or balanced as actually manufactured. If the circuit 100 is sufficiently imbalanced, the circuit will naturally "snap" to a stable state that is induced by the imbalance shortly after transistors Q1 and Q2 turn on.

For example, if transistors Q1 and Q2 have different response times, after the control node transitions to a logic 1, whichever of latch nodes 104, 105 is coupled to the faster one of transistors Q1 and Q2 will be pulled to a logic high before the latch node that is coupled to the slower one if transistor Q1 and Q2. As such, the circuit will naturally snap to a stable state in which the latch node that is coupled to the faster of transistors Q1 and Q2 will be held at a logic 1 and the latch node that is coupled to the slower of transistors Q1 and Q2 will be held at a logic 0. The value that is held at node 105 is ultimately latched into flip-flop 106 which essentially stores which specific one of two possible states the node 105 snapped to.

Even if transistors Q1 and Q2 are manufactured identically, however, the circuit 100 can still snap to a stable state if there exists sufficient manufacturing differences associated with the inverters 101, 102 themselves. As is known in the art, transistor gain variation and/or transistor threshold voltage variation can affect the time at which an inverter will cause a receiving inverter to flip its output bit. Specifically, a lower driving inverter gain and a higher receiving inverter threshold will cause the receiving inverter to flip its output bit later in time. By contrast, a higher driving inverter gain and a lower receiving inverter threshold will cause the receiving inverter to flip its output bit sooner in time. For simplicity only transistor gain and threshold have been mentioned. But other manufacturing related properties can affect the timing of an inverter loop as described above (e.g., interconnect resistance(s), contact resistance(s), variation in transistor dimension(s), random dopant fluctuation etc.).

Here, even if both of the latch nodes 104, 105 are simultaneously pulled to a logic 1 when the control node transitions to a logic 1 (because transistors Q1 and Q2 are identical), one of latch nodes 104, 105 will start to be driven to a logic 0 before the other of the latch nodes 104, 105 (again, owing to, e.g., manufacturing differences in the transistors within the inverters 101, 102). Once one of the latch nodes 104, 105 starts to be driven to a logic 0 before the other of the latch nodes 104, 105, the circuit 100 will quickly snap to a stable state that holds the latch node that was first driven to logic 0 to a logic 0 and holds the other latch node to a logic 1. Again, whichever value node 105 snaps to is stored in flip-flop 106.

FIG. 2 shows a circuit having N instances 201_1 through 201_N of a circuit, such as the PUF circuit described just above, that sets itself to a 1 or a 0 depending on its specific combination of manufacturing variation(s). In an embodiment, the circuits 201_1 through 201_N are integrated on a same semiconductor chip (whereas in other embodiments the circuits may be integrated on a same printed circuit board). For convenience, a semiconductor die will be mostly referred to as an example.

In an embodiment that, e.g., uses the aforementioned PUF circuit 100 of FIG. 1 for each of PUF circuits 201_1 through 201_N, during the final product testing of the manufactured semiconductor die, the control node 103 transitions to a 1 to cause each of the N circuits to snap to their respective stable bit value which is then stored in each circuit's respective flip-flop 202_1 through 202_N. Each of the respective stable bit values kept in the flip flops 202_1 through 202_N are then stored, in a separate nonvolatile memory 203 as a unique word or signature of the semiconductor chip. That is, with the storage of the N individual snapped-to stable bits into the non volatile memory 203, the nonvolatile memory circuit 203 is essentially storing a signature of the specific distribution of the associated fabrication induced variation properties at the time of manufacture of the semiconductor chip.

As is known in the art, over the course of time and use, electronic circuitry will degrade such that at least one of its manufacturing related properties will change. As a consequence, the N PUF circuits 201_1 through 201_N may begin to demonstrate a change in their behavior. As such, the respective N bit signature may change over time. In the case of a reliability problem or manufacturing defect that corresponds to a serious degradation problem, the signature will change some significant amount which can subsequently be flagged as an early detection warning that the electronic chip or board is prone to imminent failure. As such, corrective action can be taken before a more serious fatal hard failure occurs. As such, readouts of the signature are made from time to time during the lifetime of the chip and compared by a comparator 205 to the original signature that was captured at manufacture and stored in the non volatile memory 203. Upon detection of a significant difference between the current signature and the original signature, an error flag 206 is raised.

The discussion above with respect to FIGS. 1 and 2 assumed that each of the PUF circuits 201_1 through 201_N will snap to a stable value. There can be instances, however, where a PUF circuit as manufactured is symmetrical or balanced such that it does not snap to a stable state when the control node transistions to a logic 1. For example, if transistors Q1 and Q2 are manufactured identically and both invertors are manufactured identically, the aforementioned mechanisms that snap the PUF circuit to a stable state may not arise. As such, the PUF circuit does not immediately snap to a stable state and instead remains in an unstable state for an extended period of time and/or, the PUF circuit will snap to a state based on temporal conditions like thermal noise, voltage droop, coupling from other circuits etc. Hence there is a high chance it will resolve to different states when evaluated multiple times.

Recognizing that the flip-flop 106 is designed to capture the value of node 105 a short time after the control value is set to a logic 1 (e.g., upon the control node 103 transitioning back to a logic 0 a short time after the control node 103 transitioned to a logic 1), the flip-flop 106 will latch either a 1 or 0 because the PUF circuit 100 did not snap to a stable state before the flip-flop 106 latched in its input value.

Circuits that behave in this manner (do not consistently resolve to one state) are unstable. In an embodiment, referring to FIG. 2, unstable PUF circuits are identified and their corresponding latched bit as read from their respective flip-flop are ideally not used for the signature code of the circuit that is used to detect chip degradation problems. As such, the signature word that is actually used is less than N bits. Here, the bits from unstable PUF circuits are marked as "dark bits". A dark bit mask vector (hereinafter, "dark bit mask") is also stored in the non volatile memory 203 that identifies which ones of the N bits from N PUF circuits emanate from an unstable PUF circuit. The dark bit mask is used to ignore the bits generated from the unstable PUF circuits whenever the signature for the circuit is being determined. The same positioned bits are also ignored by the comparator 205 when performing its comparison.

FIG. 3 shows an improved PUF circuit 300 that can reduce or minimize its propensity to be deemed unstable. Here, as observed in FIG. 3, a counter 307 is coupled to receive the specific bit value that is latched into the flip flop 306. Rather than take only one sample (i.e., transition the control value 103 to a value of 1 once per read of the PUF circuit 100 as described above with respect to FIG. 1), instead, multiple samples of the circuit 300 are taken and fed to a counter 307. Here, multiple samples are taken by driving the control node 303 with a clock signal (CLK). Each time the clock transitions to a logic high, the circuit 300 will re-attempt to snap to a stable value. Upon each sample (i.e., each clock transition to a logic 1), the value latched by the flip-flop 306 is provided to the counter 307. In an embodiment, if the flip-flop 306 has latched a 1 the counter 307 will increment, or, if the flip-flop 306 has latched a 0 the counter 307 will not increment.

If after a number of clock transitions (samples) a vast majority of the latched values correspond to a 1, the counter value 307 will have surpassed some threshold (Y) deemed sufficient to deem the circuit 300 stable at a value of 1. By contrast, if after a sufficient number of clock transitions (samples) the vast majority of the latched values correspond to a 0, the counter 307 will stay beneath some lower threshold (X) (e.g., a value just above 0) and the circuit 300 will be deemed stable at a value of 0. Here, although the circuit 300 may be unstable in the context of only one sample, it is possible that there exist latent mechanisms that will cause the circuit 300 to snap to one of the values much more frequently than the other of the values. In such cases, with enough samples taken, the circuit 300 can be deemed stable rather than unstable.

As such, with the improvement of taking a number of samples rather than just one sample, a number of the PUF circuits 201 of FIG. 2 may be deemed stable rather than unstable, which, in turn, reduces the size of the dark bit mask and instead expands the size of the unique signature of the semiconductor chip. With a larger size signature, degradation of the semiconductor chip will be more readily identified in advance of a hard failure than is possible with a smaller size signature.

Still yet another problem is the dependency that PUF circuit can have on existing conditions such as temperature and voltage. For example, a specific one of the PUF circuits 201 of FIG. 2 may be stable at a first set of conditions yet be unstable at a second set of conditions. Likewise, another specific one of the PUF circuits 201 of FIG. 2 may be unstable at the first set of conditions yet be stable at the second set of conditions.

Here, the inability to precisely characterize which PUF circuits 201 are stable and which circuits are unstable threatens the viability of the overall technique in that the dark bit mask may be accurate for one set of conditions but is not accurate for a different set of conditions. Storing different dark bit masks for different conditions is possible, but a more robust approach includes the ability to initially deem each of the PUF circuits 201 as stable or unstable at manufacturing and then have those characterizations remain accurate over the lifetime of the circuit irrespective of the conditions that the semiconductor chip is subject to.

Thus, in order to enhance the ability to permanently characterize a PUF circuit as stable or unstable, FIG. 3 also shows the existence of a multiplexer 309 that is used to program a value into the PUF circuit 300 that causes the circuit 300 to drive itself towards being stable or unstable during a burn-in sequence.

A burn-in sequence is a special stress test that is applied to circuits as part of their standard manufacturing process. Here, elevated temperatures and/or voltages are applied to the manufactured chip or board to age the transistors and other manufactured features to their more permanent state. That is, early in the life of a circuit, various parameters of its constituent transistors and other manufactured features will drift (e.g., logarithmically) toward a respective more permanent, "settled in" state. The burn-in is designed to cause these parameters to reach this state before the manufactured circuit is actually shipped.

In the PUF circuit 300 of FIG. 3, if the circuit 300 is deemed stable because it consistently snaps to a same logic value as reflected from the counter output (count value is greater than Y or less than X), and if the opposite of that value is presented to the second multiplexer input 311 during a burn-in, the presentation of the opposite value to the multiplexer 309 during the burn-in will have the effect of strengthening the circuit's stability.

Here, the circuit of FIG. 3 is programmed by a user (e.g., a burn-in test program executed on a manufacturing facility) placing a logic value at the second input 311 of the multiplexer 309. During the burn-in, the BURN-IN input 312 is a logic high which disables the clock input 303. The second input 311 of the multiplexer 309 is selected which causes the flip-flop 306 to latch the user provided value. In the case of a stable circuit, as discussed above, the opposite value that the circuit snaps to at node 305 is latched into the flip-flop 306 which has the effect of driving node 305 harder to its stable value thus strengthening the stability of the circuit through accelerated ageing.

In the case of an unstable circuit, the same value that the circuit tends to snap to is programmed at the second input 311 of the multiplexer 309 and latched by the flip-flop 306 which has the effect of driving node 305 harder to an opposite value than the value that the circuit tends to snap to, which, in turn, destabilizes the circuit even further. In an embodiment, delay buffering (e.g., a pair of inverters in series (not shown)) is placed at the front of the gate nodes of both of transistors Q1 and Q2 to inject a differential delay bias for the burn-in (when the CLK is disabled) that enhances the stability strengthening/weakening process for the circuit during the burn-in.

Thus, if the PUF circuit 300 consistently snaps to a 1 and then a 0 is presented to the second multiplexer input 311 during a burn-in, the circuit 300 will work harder to drive itself to a 1 at latch node 305 which causes the circuit to settle/mature with an even greater propensity to snap to a 1. Likewise, if a PUF circuit 300 consistently snaps to a 0 and then a 1 is presented to the second multiplexer input 310 during a burn-in, the circuit 300 will work harder to drive itself to a 0 at latch node 305 which causes the circuit 300 to settle/mature with an even greater propensity to snap to a 0.

The opposite is also true. That is, if the circuit 300 is deemed stable because it consistently snaps to a same logic value, and if the same value is presented to the second multiplexer input 311 during a burn-in, the presentation of the same value during the burn-in will have the effect of weakening the circuit's stability.

For example, if the PUF circuit 300 consistently snaps to a 1 and then a 1 is presented to the second multiplexer input 311 during a burn-in, the circuit 300 will work harder to drive itself to a 0 at latch node 305 which causes the circuit to settle/mature with less of a propensity to snap to a 1 than it did before the burn in. As such, the circuit is more unstable after the burn-in than before the burn-in. Likewise, if the PUF circuit 300 consistently snaps to a 0 and then a 0 is presented to the second multiplexer input 311 during a burn-in, the circuit 300 will work harder to drive itself to a 1 at latch node 305 which causes the circuit 300 to settle/mature with less of a propensity to snap to a 0 than it did prior to the burn in. Again, the circuit 300 is more unstable after the burn-in than before the burn-in.

Thus, programming the PUF circuit 300 with the opposite of the value it naturally stabilizes to has the effect of strengthening that stability. By contrast, programming the PUF circuit 300 with the same value that it naturally stabilizes to has the effect of unstabilizing the circuit 300.

When not in a burn-in mode, the BURN_IN input 312 is low which enables the clock input 303 and effectively disables the feedback path from the flip-flop to transistors Q1 and Q2. The first input 310 of the multiplexer 309 is selected which causes the circuit to operate normally as described above.

Recall the above discussion with respect to FIG. 2 that being able to permanently declare each of the PUF circuits 201_1 through 201_N as stable or unstable is important if a dark bit vector is to be generated that is accurate over multiple, different conditions. Thus, in an embodiment, those of the PUF circuits 201_1 through 201_N that are deemed stable after a number of samples are taken are given an opposite value during burn-in to further strengthen their stability. By contrast, those of the PUF circuits 201_1 through 201_N that are deemed unstable after a number of samples are taken are given a same value during burn-in to further strengthen their instability.

Note that the PUF circuits of FIGS. 1 and 3 can be implemented as hardware circuitry disposed on a semiconductor chip or printed circuit board. With respect to the PUF circuit of FIG. 3, the counter circuitry 307 and/or threshold detection circuitry 308 can be implemented as a custom hardwired circuit, a programmable circuit (e.g., a programmable logic device (PLD), programmable logic array (PLA) or field programmable gate array (FPGA)) or a circuit that executes some form of program code such as a controller (e.g., a microcontroller) or processer (e.g., an embedded processor) or any combination of these. The signature checking circuit of FIG. 2 can also be implemented on a semiconductor chip or printed circuit board. Here, the comparison checking circuitry 205 can be implemented as a custom hardwired circuit, a programmable circuit (e.g., a programmable logic device (PLD), programmable logic array (PLA) or field programmable gate array (FPGA)) or a circuit that executes some form of program code such as a controller (e.g., a microcontroller) or processer (e.g., an embedded processor) or any combination of these.

FIG. 4 shows a testing methodology that operates as described above. Here, a plurality of PUF circuits are tested for stability 401, e.g., by taking a number of samples such as driving a control node with a clock signal as described above with respect to FIG. 3. Those of the PUF circuits that are deemed stable (e.g., because their respective counter reached a certain high threshold or stayed below a certain low threshold) are programmed with a value (e.g., the opposite value they stabilized to) for burn-in that strengthens their stability 402.

By contrast, circuits that are deemed unstable (e.g., because the counter did not reach a certain high threshold and rose above a certain low threshold) are identified as unstable and programmed with a value (e.g., the same value they showed some stabilization toward) for burn-in that strengthens their instability 403. The circuits are then burned-in, a dark bit mask vector is created (e.g., that identifies the unstable PUF circuits) and signature vector is created (e.g., that records the respective values from the stable PUF circuits) 404.

FIG. 5 shows a depiction of an exemplary computing system 500 such as a personal computing system (e.g., desktop or laptop) or a mobile or handheld computing system such as a tablet device or smartphone, or, a larger computing system such as a server computing system. As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

The computing system 500 may include (e.g., on a printed circuit board of the computing system and/or within a semiconductor chip of the computing system) that PUF circuits as described above where the PUF circuits can be sampled multiple times to further access stability and/or were burned-in such that initially stable circuits were burned in to strengthen their stability and initially unstable circuits were burned in to weaken their stability.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of software or instruction programmed computer components or custom hardware components, such as application specific integrated circuits (ASIC), programmable logic devices (PLD), digital signal processors (DSP), or field programmable gate array (FPGA).

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a physically unclonable (PUF) circuit having a programmable input, the programmable input to receive a value that caused the PUF circuit to strengthen its stability or strengthen its instability, the PUF circuit further comprising a clock signal input to receive a clock signal for taking respective samples of values that the PUF circuit resolved to.

2. The apparatus of claim 1 wherein the value was received prior to a burn-in.

3. The apparatus of claim 1 wherein the PUF circuit further comprises counter circuitry and threshold detection circuitry to determine whether the PUF circuit is stable or unstable.

4. The apparatus of claim 3 wherein the PUF circuit further comprises a latch circuit for latching the multiple samples.

5. The apparatus of claim 1 wherein the PUF circuit is one of a plurality of PUF circuits, the plurality of PUF circuits being part of signature checking circuitry.

6. The apparatus of claim 1 further comprising signature checking circuitry that comprises a non volatile memory to store a signature code for a circuit that the signature checking circuit is integrated with.

7. The apparatus of claim 6 wherein the non volatile memory stores a dark bit mask that identifies unstable ones of the PUF circuits, wherein respective values from the unstable ones of the PUF circuits are not included in the signature code.

8. A computing system, comprising:
a plurality of processing cores;
a memory controller coupled to the plurality of processing cores;
a system memory coupled to the memory controller;
a flat panel display;
a signature checking circuit comprising a plurality of PUF circuits, each of the PUF circuits comprising a programmable input, the programmable input to receive a value that caused its respective PUF circuit to strengthen its stability or strengthen its instability.

9. The computing system of claim 8 wherein the value was received prior to a burn-in.

10. The apparatus of claim 9 wherein each PUF circuit further comprises a clock signal input to provide for the taking of multiple samples of a second value that each PUF circuit latches.

11. The computing system of claim 8 wherein each PUF circuit further comprises respective counter circuitry and threshold detection circuitry to determine whether its respective PUF circuit is stable or unstable.

12. The apparatus of claim 8 wherein the signature checking circuitry comprises a non volatile memory to store a signature code for a circuit that the signature checking circuit is integrated with.

13. The apparatus of claim 12 wherein the non volatile memory stores a dark bit mask that identifies unstable ones of the plurality of PUF circuits, wherein respective values from the unstable ones of the plurality of PUF circuits are not included in the signature code.

14. The apparatus of claim 8 wherein the signature checking circuit is disposed on a printed circuit board of the computing system.

15. The apparatus of claim 8 wherein the signature checking circuit is disposed on semiconductor chip of the computing system.

16. A method, comprising:
   testing a plurality of PUF circuits for stability;
   programming those of the plurality of PUF circuits that are deemed stable with a respective value that strengthens their stability;
   programming those of the plurality of PUF circuits that are deemed unstable with a respective value that strengthens their instability;
   burning-in the plurality of PUF circuits;
   generating a dark bit mask; and,
   generating a signature vector.

17. The method of claim 16 wherein the testing of the plurality of PUF circuits further comprises taking multiple samples of each of the PUF circuits.

18. The method of claim 17 wherein the respective value that the stable PUF circuits are programmed with corresponds to a different respective value that the stable PUF circuits have a propensity to latch to.

19. The method of claim 17 wherein the respective value that the unstable PUF circuits are programmed with corresponds to a same respective value that the unstable PUF circuits have a propensity to latch to.

20. The method of claim 16 wherein the plurality of PUF circuits are disposed on a printed circuit board.

21. The method of claim 16 wherein the plurality of PUF circuits are disposed on a semiconductor chip.

22. An apparatus, comprising:
   a physically unclonable (PUF) circuit having a programmable input, the programmable input to receive a value to cause the PUF circuit to strengthen its stability or strengthen its instability, the PUF circuit further comprising a clock signal input to receive a clock signal for taking multiple samples of the PUF circuit to measure the PUF circuit's stability.

23. An apparatus, comprising:
   a signature checking circuit comprising a plurality of PUF circuits, each of the PUF circuits comprising a programmable input, the programmable input to receive a value to cause its respective PUF circuit to strengthen its stability or strengthen its instability.

* * * * *